July 28, 1970 W. KAFKA 3,522,361

ELECTRICAL INSTALLATION FOR PARALLEL-CONNECTED SUPERCONDUCTORS

Filed April 17, 1968 2 Sheets-Sheet 1

ELECTRICAL INSTALLATION FOR PARALLEL-CONNECTED SUPERCONDUCTORS

United States Patent Office 3,522,361
Patented July 28, 1970

3,522,361

ELECTRICAL INSTALLATION FOR PARALLEL-CONNECTED SUPERCONDUCTORS

Wilhelm Kafka, Tennenlohe, Germany, assignor to Siemens Aktiengesellschaft, Berlin and Munich, Germany, a corporation of Germany Filed Apr. 17, 1968, Ser. No. 722,037
Claims priority, application Germany, Apr. 29, 1967, S 109,662
Int. Cl. H01b 7/34
U.S. Cl. 174—15 7 Claims

ABSTRACT OF THE DISCLOSURE

An electrical installation wherein a plurality of superconductors are connected in parallel with current flowing therethrough while the superconductors are maintained at a superconducting temperature below their critical temperature. All of the parallel-connected superconductors terminate at a low-temperature location where they are respectively connected to a plurality of separate elongated intermediate conductors of normal conductivity which are spaced from each other and extend from said low-temperature location to a higher temperature location. At the latter location a common conductor of relatively large cross section is electrically connected with all of the intermediate conductors and extends from said higher temperature location to a still higher temperature location. At all of the latter temperature locations there are a plurality of temperature-control means for maintaining at the low-temperature location a temperature below the critical temperature of the superconductors, at the higher temperature location a temperature higher than that at the low-temperature location, and at the still higher temperature location a temperature higher than that at the higher temperature location.

Figure 1:
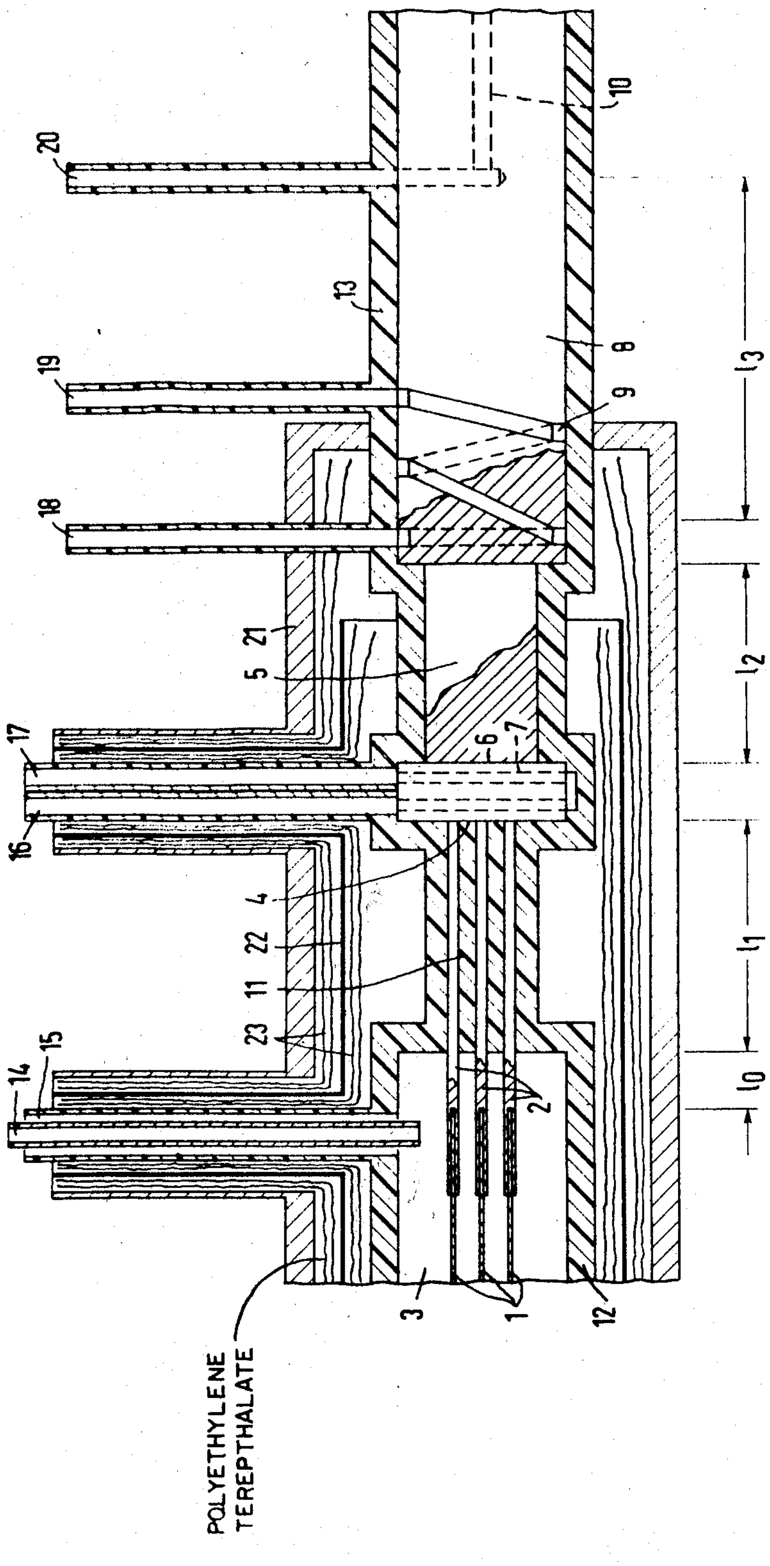

My invention relates to an electrical installation for directing current through a plurality of superconductors which are connected in parallel with the superconductors being at a temperature lower than their critical temperature during operation of the installation. The several parallel-connected superconductors are respectively connected with conductors of normal conductivity at a location where the temperature is less than the critical temperature of the superconductors.

In electrical installations which include superconductors, such as, for example, superconducting cables, coils, or machines, it is often necessary to transmit the electrical current between a location where the temperature is less than the critical temperature of the superconductors and a location where there is a substantially higher temperature, particularly room temperature. Inasmuch as superconductors lose their superconducting capability at room temperature, the transition between these locations of different temperatures is brought about by way of conductors of normal conductivity, such as, for example, aluminum or copper, the latter normal conductors being connected with the superconductors at the location where the temperature is lower than the critical temperature.

In various different electrical installations of this type, there are a plurality of superconductors which do not have any superconducting connections therebetween and which are operated while connected in parallel, the parallel connection being brought about by way of material of normal electrical conductivity. In an installation of this type it is often desirable to load the several superconductors with equal currents, respectively. However, this desired uniform current distribution is prevented because of the resistance encountered at the connections of the superconductors with the material or normal electrical conductivity as well as because of resistances encountered along the individual superconductors. Such resistances can, for example, be encountered when relatively long superconducting cables must be made up of a plurality of different superconducting sections joined together to form a conductor, or when within the structure there are switch contacts situated along a superconductor. In the event that the total resistance encountered along the several superconductors differ from each other, there will be during operation of the installation a current distribution in the normal conducting material which corresponds to these different resistances, and thus the individual superconductors will be loaded with different currents.

It is accordingly a primary object of my invention to provide a construction of the above general type where there is an assurance of a uniform current distribution in a plurality of superconductors which are connected in parallel.

Also, it is an object of my invention to provide an electrical installation of the above general type wherein losses resulting from transmission of current are maintained as small as possible.

In accordance with my invention, the ends of the several parallel-connected superconductors are respectively connected with intermediate conductors of normal conductivity at a location which is below the critical temperature, and from the latter location these conductors of normal conductivity extend to a higher temperature location while they are maintained electrically separated from each other. At this latter, higher temperature location the ends of the intermediate normal conductors are connected with a common electrical conductor of larger cross section, and this latter common conductor extends to a still higher temperature location. All of the individual intermediate normal conductors have the same electrical resistance, and this resistance is relatively large as compared to the resistances at the connections of the intermediate conductors with the superconductors as well as relatively large with respect to any other resistances encountered in the installation along the superconductors themselves.

The electrically separated intermediate conductors of normal conductivity which are respectively connected with the superconductors function as series resistors respectively connected to the individual superconductors and with respect to which the resistances encountered along the individual superconductors are negligibly small so that these intermediate normal conductors can determine the current distribution in the superconductors. By providing equal resistances in all of the electrically separated intermediate normal conductors, equal currents will be directed through all of the superconductors. At the same time the intermediate conductors of normal conductivity serve to conduct current to and from the superconductors so that separate series resistors which would result in additional losses are avoided.

The reference to equal electrical resistances is to be interpreted as equal resistances in the technical sense. Differences of a small percentage are often unavoidable for technical reasons.

A particularly good uniform distribution of the electrical current among the several superconductors can be achieved by providing for the electrically separated intermediate normal conductors a resistance which is at least ten times as great as the greatest total resistance encountered along the individual superconductors. This latter total resistance is to be understood as the sum of all of the resistances encountered along an individual superconductor.

According to a particularly simple construction according to my invention, the individual, electrically separated, intermediate conductors of normal conductivity all have the same length and the same cross section, they are all of the same material, and during operation they all have the same temperature distribution between the superconductors and the normal common conductor of larger cross section. This uniform temperature distribution is important inasmuch as the specific resistance of the material of the normal conductors, such as, for example, copper or aluminum, depends upon the temperature.

With this construction of my invention it is possible to achieve a uniform temperature distribution along the several individual intermediate normal conductors by locating elongated portions of the normal conductors which are connected to the superconductors and which are all of the same length within the liquid refrigerating medium of the lowest temperature, while the portions of these intermediate normal conductors which extend from the liquid refrigerant to the common conductor of larger cross section are embedded within an insulating material, the connection between the intermediate conductors and the common conductor being maintained by a temperature-control means at a temperature higher than the temperature at the connections between the intermediate conductors and the superconductors. As a result of the location of the ends of the intermediate normal conductors in the liquid refrigerating medium and the cooling of the connections thereof to the common conductor of larger cross section, both ends of each intermediate conductor which acts as a series resistance are provided with predetermined temperatures, respectively. As a result of the body of insulation between the superconductors and the common conductor, in which the intermediate conductors are embedded so as to be closely engaged and surrounded by the insulation, the refrigerating medium cannot flow along the intermediate conductors where they are embedded in the insulation and thus these conductors are only in engagement with the refrigerating medium at their exposed portions which are connected to the superconductors. Therefore, between the low-temperature location where the intermediate conductors are connected to the superconductors and the higher temperature location where the intermediate conductors are connected to the common conductor of larger cross-section, these intermediate conductors of normal conductivity will have because of their thermal conduction a temperature distribution which is uniform for all of the intermediate conductors. The lengths of the exposed portions of the intermediate conductors which are situated within the liquid refrigerating means and which are connected to the superconductors, respectively, are chosen in such a way that the formation of a skin or boundary layer of vaporized refrigerating medium at the exterior surfaces of the conductors within the liquid refrigerant is avoided during operation of the installation. Such a skin of vaporized refrigerating medium at the exterior surfaces of the intermediate conductors could result in a lessening of the degree to which heat is carried away and thus localized heating of the conductors could take place with the result that the uniform temperature distribution could under certain circumstances be interfered with. Moreover, in order to prevent the formation of such a skin of vaporized refrigerant, these intermediate conductors can be provided with cooling fins.

In order to reduce the amount of power required for refrigerating purposes, the body of insulating material through which the intermediate conductors extend can be formed between its ends with an interior hollow space through which the intermediate conductors freely extend and in which an additional cooling location is provided by way of a temperature-control means which communicates with this space. Thus, at this additional cooling location a cooling medium will be used which will provide a temperature between the low temperature at the connections with the superconductors and the higher temperature at the connection between the intermediate conductors and the common conductor of larger cross section.

Furthermore, in order to further reduce the required cooling power it is of advantage to provide the structure of my invention with a still further normal conductor of an even larger cross section than the common conductor connected to the end of the latter which is distant from the intermediate conductors and cooled in a stepwise manner through additional cooling locations.

Figure 2:
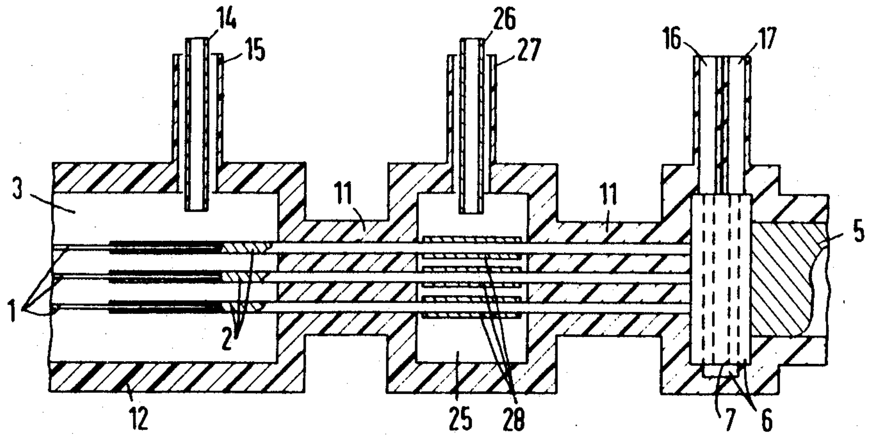

My invention is illustrated by way of example in the accompanying drawings which form part of this application and in which:

FIG. 1 is a schematic fragmentary sectional elevation of an embodiment of an installation of my invention, FIG. 1 showing only that much of the installation which is required for a full understanding of my invention; and FIG. 2 is a schematic sectional fragmentary elevation of a further embodiment of a structure of my invention.

Referring now to FIG. 1, superconductors 1 are illustrated therein at the end regions thereof which are respectively connected electrically to the intermediate conductors 2 of normal conductivity. In order to reduce the resistance at the transition connection between the superconductors and normal conductors, respectively, the ends of the superconductors are completely embedded within the material of the normal conductors. The connections between the superconductors and normal conductors are situated at a low-temperature location defined by a refrigerating chamber 3 which is filled, for example, with liquid helium which has a temperature of approximately 4.2° K., this latter temperature being below the critical temperature of the superconductors 1. The normal conductors 2 extend from the low-temperature location where they are connected with the superconductors up to a higher temperature location 4 where the several intermediate conductors 2, which are maintained electrically separated from each other, are electrically connected with one end of a normal conductor 5 of larger cross section, so that this conductor 5 is a common conductor for the several individual conductors 2. The common conductor 5 of normal conductivity can, for example, be made of massive, preferably ultrapure aluminum, and the several intermediate conductors 2 are soldered directly into the aluminum of the common conductor 5. At the location of the connection between the conductors 2 and the common conductor 5, which is the higher temperature location, a temperature control means is provided for maintaining the temperature at the higher temperature location 4 higher than that at the low-temperature location 3, and this latter temperature-control means includes a refrigerating block 6 which is formed with refrigerating passages 7 through which a refrigerant flows. For example, these passages 7 can have a gaseous helium at a temperautre of 20° K. flowing therethrough. The end of the common conductor 5 which is distant from the intermediate conductors 2 is electrically connected with further conductor 8 of even larger cross section which also may be made, for example, of aluminum. The region where the conductors 5 and 8 are connected to each other forms a still higher temperature location, and at this latter location the conductor 8 may be formed at its exterior with a spiral groove 9 forming a passage for a refrigerating medium which, for example, may be liquid nitrogen at a temperature of approximately 77° K., this latter refrigerant flowing through and becoming vaporized within the spiral passage 9. A further, even higher temperature location is formed by way of the passage 10 through which water can flow.

The several intermediate conductors 2 of normal conductivity have exposed elongated portions of equal length situated within the refrigerating chamber 3 which forms the low-temperature location and connected directly to the superconductors 1, respectively, as pointed out above, so that these exposed portions of the conductors 2 are directly surrounded and engaged by the liquid helium. From their exposed end portions in the chamber 3 all the way up to the common conductor 5, the intermediate conductors 2 are embedded within a body of insulation 11. The material used for the insulation 11 is capable of withstanding the potential encountered between the cable and ground. For example, the insulating body 11 may be made of polyethylene, a suitable resin, or plastics such as nylon or polytetrafluoroethylene known under the trade name "Teflon." The wall 12 which defines the chamber 3 as well as the envelope 13 which houses the normal conductors 5 and 8 are also made of insulating material.

At the several different temperature locations, which is to say the low temperature location where the superconductors are connected to the intermediate conductors 2, the higher temperature location 4 where the conductors 2 are connected to the common conductor 5, and a still higher temperature location where the conductors 5 and 8 are connected to each other, as well as the location of the passage 10, there are plurality of temperature-control means for maintaining these locations at predetermined temperatures. Thus, the temperature-control means at the low-temperature location 3 includes an inner supply tube 14 which supplies liquid helium into the interior of the chamber 3, this tube 14 being surrounded by and spaced from a concentric tube 15 through which helium vapor can flow out of the refrigerating chamber 3. The gaseous helium at the higher-temperature location 4, where this cooling medium is directed through the passage 7 of the block 6, is provided by way of a temperature-control means which includes the pipes or tubes 16 and 17 through which the gaseous helium is conducted. The temperature-control means for the passage 9 at the still higher temperature location includes tubes 18 and 19 communicating with opposed ends of the passage 9 and serving to direct liquid nitrogen through the pipe or tube 18 to the passage 9 while the vaporized nitrogen is taken away by the tube 19. Thus, the nitrogen which vaporizes within the passage 9 escapes through the tube 19. The tube 20 of the final temperature-control means shown in FIG. 1 serves to direct cooling water to the passage 10. The several tubes 14–20 are also all made of insulating material. Those parts of the structure which are at the temperature of liquid nitrogen and at lower temperatures are situated at the locations where the refrigerating mediums are directed into and out of the structure within a vacuum-tight casing 21 providing an interior evacuated atmosphere. Within the vacuum-tight casing 21 there is a casing 22 forming a radiation shield, the shield 22 being made, for example, of aluminum or copper sheet. Also, within the vacuum-tight casing there are different layers of crumpled, aluminum-coated polyethylene-terephthalate foil 23, known under the trade name "Superisolation."

The normal intermediate conductors 2 are constructed in such a way that they all have the same resistance which is a relatively large resistance as compared to the transition resistance at the connections with the superconductors as well as as compared to the resistances encountered along the superconductors themselves. The length $l_0$ of that portion of each conductor 2 which is situated within the refrigerating chamber 3 is selected so that during the refrigeration of the conductors 2 the formation of a skin of vaporized liquid refrigerant at the exterior surfaces of the conductors 2 is avoided.

Moreover, the length $l$ and the cross section Q of those portions of the conductors 2 which are situated between the lower temperature location and the higher temperature location will have with respect to each other the ratio $$\frac{l}{Q}=\sqrt{\frac{2k_m\cdot\Delta T}{I^2\cdot s_m}}$$

In this latter equation, $k_m$ represents the average thermal conductivity and $s_m$ the average specific resistance of the normal conducting material in the given temperature range, while $\Delta T$ represents the difference between the temperatures at the low-temperature and higher temperature locations while $I^2$ represents the electrical current flowing through the normal conductors 2 during the operation of the structure. As is described in detail in an article by McFee in the publication "Review of Scientific Instruments," vol. 30, 1959, pages 98–102, with this ratio between the length and cross section of a conductor, the escape of heat at the colder end of the conductor is a minimum. Therefore, there will be no flow of heat into the conductor at the warmer end thereof, and the heat discharging at the cooler end of the conductor results from the ohmic losses within the cross section of the conductor. The cross sections of the individual conductors 2 are selected in such a way that a favorable construction will result and the conductor surfaces at the cooling locations are adequate for the purposes of leading away heat losses encountered in the individual conductor sections.

The above considerations apply not only to the conductors 2 but also to the common conductor 5 and the conductor 8 of even larger cross section. The lengths of these conductors between the individual cooling locations are indicated at $l_1$, $l_2$ and $l_3$ in FIG. 1.

In an installation constructed according to my invention, which conforms substantially to the structure shown in FIG. 1, the superconductive cable has a length of 100 km. and is made up of 127 individual superconductive wires connected in parallel and made of the superconducting alloy niobium-33 At. percent zirconium. The individual superconducting wires each have a diameter of 0.25 mm. The 127 individual superconductors are each made up of interconnected sections each of which has a length of 10 km. The transition resistance at each connection between a pair of sections of each superconducting wire is with a suitable interconnection at a maximum on the order of $10^{-9}$ ohm. With the structure of my invention each of the 127 superconductors 1 is connected with a normal conducting wire 2 made of aluminum of a purity of approximately 99.99 percent and having a diameter $d$ of approximately 1.28 mm. The transition resistance at the connection of each superconductor with an intermediate normal conductor 2 is also a maximum of approximately $10^{-9}$ ohm. Therefore, along each of the individual superconductors 1 there will be along the entire length of the cable a total resistance which is a maximum of approximately $10^{-8}$ ohm. The resistance of each intermediate conductor 2 therefore should be large as compared to $10^{-8}$ ohm, in order to assure a uniform current distribution in the superconductors 1. The rated current I of the cable is $2\cdot10^4$ amperes.

The conductors 2 each have a length of 45 cm. Each conductor 2 has within the refrigerating chamber 3 at the lower-temperature location an elongated section having a length $l_0$ which is 4 cm., and the length $l_1$ of each of the conductors 2 which is embedded within the body of insulation 11 is 41 cm. The cross-sectional area of each conductor 2 is on the order of 1.28 mm.$^2$. With a specific resistance $s_0$ of approximately $6\cdot10^{-9}$ ohm·cm. for the conductor section $l_0$ which is at the temperature of the liquid helium and at an average specific resistance $s_m$ of approximately $7\cdot10^{-9}$ ohm·cm. for the intermediate conductor section having the length $l_1$, the electrical resistance of each conductor 2 is approximately $2.4\cdot10^{-5}$ ohm, so that it is much greater than $10^{-8}$ ohm, and thus greater than ten times the resistance of the superconductor. The dimensions of each conductor 2 also correspond at the same time to the above-mentioned advantageous ratio between the conductor length and conductor cross-section and in addition each conductor 2 fulfills the requirement that the length $l_0$ should be of such magnitude that no helium vapor skin can form at the exterior surface of the conductor section which is immersed within the liquid helium.

During refrigeration at the lower temperature location 3 with liquid helium at a temperature of 4.2° K., and at the higher temperature location 4 with gaseous helium at a temperature of 20° K., the temperature difference between these cooling locations for that part of each intermediate conductor 2 which is embedded within the insulation 11 and which has the length $l_1$ is $\Delta T=15.8°$ K. The average thermal conductivity of the conductor cross section $k_m$ is on the order of 55 w./cm. ° K. Using the equation $$l_1=Q\sqrt{\frac{2k_m\cdot\Delta T}{I^2.s_m}}$$

with the above values for I, $k_m$, $s_m$ and ΔT and using further the fact that the current I is distributed among all 127 conductors, then $Q=127\cdot1.28$ mm.$^2$=1.63 cm.$^2$, so that in this way it will be seen that the length $l_1$ is indeed equal to 41 cm.

Because of the ohmic losses encountered in the 127 individual conductors 2 at the regions thereof having the length $l_1$ indicated in FIG. 1, there will be at the cooler end of this insulation covered section a heat flow $P_1=I^2s_ml_1Q^{-1}=70$ w. This heat flow and the heat created in the several portions of the conductors 2 within the chamber 3 as a result of the ohmic losses $P_0=I^2\cdot s_0l_0Q^{-1}$ in the 127 conductors having at this portion the length $l_0$ must be given up to the liquid helium along the length $l_0$ of each conductor 2 which is immersed within the liquid helium, so that there will be no heating of the superconductors. In order to prevent the formation of a skin of helium vapor at the exterior surfaces of the conductors 2 which are immersed within the liquid helium, the extent of heat flow through the exterior surfaces of the conductors 2 in the liquid helium must be smaller than 0.4 w./cm.$^2$.

Therefore, there must be the following relationship:

$$\frac{P_0+P_1}{127\cdot l_0\cdot d\cdot\pi}<0.4\text{ w./cm.}^2$$

Therefore, it is apparent that there is a further requirement that the length $l_0$ be greater than 3.7 cm. Since this length $l_0$ is in fact 4 cm., this later requirement is fulfilled. The ohmic losses in the 127 conductor sections of the conductors 2 which have the length $l_0$ within the liquid helium is 6 w., so that the total power loss of 76 w. must be carried off through the liquid helium. This latter result can be achieved by way of a refrigerating machine which is connected between the pipes 14 and 15.

The conductor 5, which is common to and connected with the aluminum wires 2, is also made of an aluminum of a purity of approximately 99.99%. It is cooled at its colder end with the gaseous helium at a temperature 20° K. and at its warmer end with liquid nitrogen at a temperature of 77° K. ΔT therefore equals along the length $l_2$ 57° K. The average specific electrical resistance is on the order of $0.9\cdot10^{-7}$ ohm·cm., the average thermal conductivity is approximately 24 w./cm. ° K. Therefore, if for the conductor 5 a cross-sectional area of 5 cm.$^2$ is selected for constructive reasons, there will be as a result of the above relationships for the ratio $l/Q$ a particularly favorable length for the conductor 5 of $l_2=44$ cm. The ohmic losses in the conductor 5 result in a heat flow of 320 w. at the cooler end, which is carried off in the refrigerating block 6 by way of the gaseous helium. The next following conductor 8 which includes the length $l_3$ is also made of aluminum of a purity of 99.99%. The cooler end of the conductor 8 is at the temperature of 77° K. of the liquid nitrogen, while the warmer end is at the temperature of the cooling water, this latter temperature being 300° K. ΔT is therefore 223° K. With an average specific resistance of $1.3\cdot10^{-6}$ ohm·cm., an average thermal conductivity of 3.6 w./cm. ° K., and a preselected cross-sectional area for the conductor 8 of 40 cm.$^2$, there will result from the above relationships for the section of the conductor situated between the connection between the conductors 5 and 8 and the cooling location of the pipe 20 a length $l_3$ which is equal to 70 cm. The heat which is carried away at the cooler end by the nitrogen which initially is liquid and then becomes vaporized is on the order of 900 w., this latter quantity representing the power loss. The following section of the aluminum conductor 8 which is at room temperature has its heat losses carried away by the cooling water which is directed through the central, axially extending passage 10 of the conductor 8.

The heat which can penetrate through the insulation from the sides of the structure into the individual conductor sections has not been taken into consideration in the above examples inasmuch as with good heat insulation this latter amount of heat is so small that it is negligible as compared to the heat losses encountered in the conductor sections themselves.

FIG. 2 illustrates a part of the structure of my invention which is different from the corresponding part thereof illustrated in FIG. 1. Those parts of FIG. 2 which correspond to parts of FIG. 1 are indicated with the same reference characters. With the installation of FIG. 2, the body of insulation 11 through which the separated normal intermediate conductors 2 extend is formed between its ends with an inner hollow space 25 forming an additional refrigerating chamber and cooling location. A temperature control means formed by the conduits or tubes 26 and 27 which communicate with the interior of the space 25 maintain in this latter space a refrigerating medium whose temperature is between the temperature at the lower temperature location 3 and the temperature at the higher temperature location 4. The intermediate normal conducting conductors 2 extend freely through the space 25 so as to be maintained at the intermediate cooling location at the temperature prevailing in the chamber 25. The refrigerating medium provided by the control means 26, 27 can, for example, be a liquid such as liquid hydrogen. Inasmuch as this latter refrigerating medium has a temperature of approximately 20° K., the cooling block 6, instead of using gaseous helium will use a liquid or gaseous cooling medium whose temperature is between 20° K. and the temperature of the liquid nitrogen of 77° K. If helium gas of a temperature of 10–30° K. is used for the additional intermediate cooling in the chamber 25, then this latter refrigerant can advantageously be derived from suitable connections to the helium refrigerator which is already connected to the tubes 14 and 15 of the temperature control means for the lower temperature location.

The exterior surfaces of the conductor sections which are to be cooled can advantageously be flattened at the cooling locations of the conductors or can be enlarged by being provided with cooling fins 28. As contrasted with the embodiment of FIG. 1, the embodiment of FIG. 2 of my invention makes it possible to gain an additional cooling stage so that the refrigerating power required to carry away the heat losses can be lessened.

It is also possible to situate additional cooling stages along sections of the conductors of larger cross section.

The above-described structure of my invention is suitable not only for superconducting cables but also for all electrical installations which are required to operate with electrical superconductors which are connected in parallel, such as, for example, superconducting coils or superconducting machines.

I claim:

1. In an electrical installation, a plurality of parallel-connected superconductors through which current flows while said superconductors are at a temperature lower than their critical temperature, all of said superconductors terminating at a predetermined low-temperature location, a plurality of separate intermediate conductors of normal conductivity spaced from each other and respectively connected to said superconductors at said low-temperature location, said intermediate normal conductors extending from said low-temperature location to a predetermined higher temperature location, a common conductor of normal conductivity of a cross section larger than said intermediate conductors connected to all of said intermediate conductors at said higher temperature location extending from the latter location to a still higher temperature location, said separate intermediate conductors of normal conductivity all having the same electrical resistance and said latter resistance being relatively large as compared to the resistance at the connections between the superconductors and intermediate conductors at said low temperature location as well as relatively large with respect other resistances encountered in the superconductors themselves, and a plurality of temperature-controlling means respectively situated at said locations for maintaining at said low-temperature location a temperature below the critical temperature of the superconductors, at said higher temperature location a temperature higher than that prevailing at said low-temperature location, and at said still higher temperature location a temperature higher than that which prevails at said higher temperature location.

2. The combination of claim 1 and wherein each of said intermediate conductors has an electrical resistance which is at least ten times as great as the greatest total resistance encountered along the superconductor connected thereto.

3. The combination of claim 1 and wherein said plurality of intermediate conductors respectively all have the same length and cross section, are all made of the same material, and all have the same temperature distribution between said low-temperature and higher temperature locations.

4. The combination of claim 3 and wherein a body of insulating material extends from said higher temperature location toward said low-temperature location, said intermediate conductors being embedded within said body of insulating material and having elongated portions extending beyond said body of insulating material to said connections with said superconductors at said low-temperature location, said temperature-control means at said low-temperature location situating the superconductors and the parts of the intermediate conductors which extend beyond said body of insulation to said low-temperature location in a liquid refrigerating medium which provides the low temperature at said low-temperature location.

5. The combination of claim 4 and wherein the lengths of those portions of said intermediate conductors which extend beyond said body of insulating material to said low-temperature location have a magnitude which prevents the formation of a skin of vaporized liquid refrigerant at the exterior surfaces of said intermediate conductors which are situated within the liquid refrigerant.

6. The combination of claim 4 and wherein said body of insulating material is formed between an end thereof which is nearest to said low-temperature location and an opposed end thereof at said higher temperature location with an intermediate hollow interior space through which said intermediate conductors extend, said space forming an additional cooling location, and temperature-control means communicating with said space for providing at said additional cooling location a temperature between the temperature at said low-temperature location and the temperature at said higher temperature location.

7. The combination of claim 1 and wherein an additional conductor of normal conductivity and of a cross section greater than that of said common conductor is connected with the end thereof which is distant from said intermediate conductors and which is located at said still higher temperature location, and said additional conductor extending away from said common conductor through at least one further temperature location, and temperature-control means at said latter temperature location for providing at the latter location a temperature which is higher than the temperature at said still higher temperature location where said common and additional conductors are connected to each other.

References Cited

UNITED STATES PATENTS

| | | | |
|---|---|---|---|
| 3,263,193 | 7/1966 | Allen et al. | 333—96 |
| 3,428,926 | 2/1969 | Bogner et al. | 335—216 |

FOREIGN PATENTS

| | | |
|---|---|---|
| 1,022,601 | 3/1966 | Great Britain. |

LEWIS H. MYERS, Primary Examiner

A. T. GRIMLEY, Assistant Examiner

U.S. Cl. X.R.

62—65; 174—95, 126